United States Patent
Renner et al.

(10) Patent No.: US 12,140,270 B2
(45) Date of Patent: Nov. 12, 2024

(54) CONDENSATE DRAINING DEVICE, ELECTRONIC ASSEMBLY AND METHOD FOR PRODUCING A CONDENSATE DRAINING DEVICE

(71) Applicant: ebm-papst Mulfingen GmbH & Co. KG, Mulfingen (DE)

(72) Inventors: Alexander Renner, Künzelsau-Weldingsfelden (DE); Denis Kraner, Bad Mergentheim (DE); Sebastian Gocyla, Buchen (DE); Christian Rost, Creglingen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 43 days.

(21) Appl. No.: 18/081,293

(22) Filed: Dec. 14, 2022

(65) Prior Publication Data
US 2023/0184378 A1    Jun. 15, 2023

(30) Foreign Application Priority Data
Dec. 15, 2021   (DE) .......................... 102021133332.6

(51) Int. Cl.
*F16T 1/38*    (2006.01)
(52) U.S. Cl.
CPC ..................... *F16T 1/38* (2013.01)
(58) Field of Classification Search
CPC ................. B60L 53/302; F16T 1/38
See application file for complete search history.

(56) References Cited

U.S. PATENT DOCUMENTS 5,894,737 A *   4/1999   Haeck ................. B60H 1/3233
                                                            62/272
9,169,945 B2 * 10/2015   Pint ......................... F16T 1/00

FOREIGN PATENT DOCUMENTS

| CN | 000212324612 U | 1/2021 |
| DE | 102019204569 A1 | 10/2020 |
| EP | 3910253 A1 | 11/2021 |

OTHER PUBLICATIONS

European Search Report dated May 4, 2023.
German Search Report dated Dec. 15, 2021.

* cited by examiner

*Primary Examiner* — P. Macade Nichols
(74) *Attorney, Agent, or Firm* — Dickinson Wright PLLC

(57) ABSTRACT

The disclosure relates to a condensate draining device for discharging condensate from at least one cooled component, which is in particular a cooled electronic system and has a surface on which condensate formation can occur, wherein the condensate draining device has a heat conducting element which has a condensation surface and which is designed to at least partially cover the surface of the at least one component and to transfer a cold causing condensation on the surface of the at least one component to the condensation surface, further having a housing with at least one condensate drain and/or a condensate chamber for collecting a condensate forming on the condensation surface, wherein the at least one condensate drain determines in each case at least one predetermined flow path which is fluidically separated from the at least one component for draining off the condensate from the housing.

10 Claims, 2 Drawing Sheets

CONDENSATE DRAINING DEVICE, ELECTRONIC ASSEMBLY AND METHOD FOR PRODUCING A CONDENSATE DRAINING DEVICE

RELATED APPLICATIONS

This application claims priority to German Patent Application No. 10 2021 133 332.6, filed Dec. 15, 2021, the entire contents of which is incorporated herein by reference in its entirety.

FIELD

The disclosure relates to a condensate draining device for draining off condensate from a component, an electronic assembly with a component and such a condensate draining device, and a method for producing such a condensate draining device.

BACKGROUND

A multiplicity of components having a cooling device are known from the prior art. In particular, if the cooling is too strong, condensation can occur on actively cooled components which, for example, are cooled by water cooling, so that condensate forms on the component.

Such condensation can occur in particular if the actively cooled component itself, which is in particular electronics and, for example, power electronics, is not in operation, so that no excess heat has to be or can be dissipated therefrom.

Condensate forming on the component can cause corrosion and short circuits, so that the component is damaged by the condensate.

Various countermeasures are already known to prevent such damage.

For example, it is provided to encapsulate the component at least partially with a potting compound so that condensation does not occur on the component itself but on the potting compound. However, in the process of this, the condensate is usually not discharged from the potting compound, so that this can lead to defects and damage in regions adjacent to the component or in regions of the component that are not encapsulated.

BRIEF SUMMARY

It is therefore the object of the disclosure to overcome the aforementioned disadvantages and to provide a condensate draining device, an electronic assembly and a production method, wherein a condensate is to be completely fluidically separated from the component and is preferably to be dischargeable independently of a spatial orientation of the component and/or the condensate draining device.

This object is achieved by the combination of features according to patent claim 1.

According to the disclosure, therefore, a condensate draining device for draining off condensate from at least one cooled component is proposed. The at least one component is in particular cooled electronics or electronic components, such as power electronics, which can be cooled by water cooling. For the sake of simplicity, the term (individual) component is used in the following, wherein this is to be understood in each case as at least one component. Such a component has a surface on which, at least without the condensate draining device according to the disclosure, condensate formation can occur. According to the disclosure, it is provided that the condensate draining device has a heat conducting element with a condensation surface. The heat conducting element is formed in particular from an electrically non-conductive material and preferably rests closely and directly against the surface of the component so that no cavity is formed between the component, and in particular the surface of the component, and the heat conducting element in which condensation can occur. The heat conducting element is designed to cover the surface of the component at least in sections or partially and in particular completely, and to transfer cold resulting in condensation on the surface of the component to the condensation surface so that condensate formation does not occur on the surface of the component but on the condensation surface. For targeted control of condensation, the condensation surface can be smaller than the surface of the component. Further, the condensate draining device according to the disclosure comprises a housing which is preferably formed of a material having poor thermal conductivity compared to the heat conducting element. The housing is provided with at least one condensate drain but preferably a plurality of condensate drains and/or a condensate chamber for collecting or receiving a condensate forming on the condensation surface. The at least one condensate drain determines or defines in each case at least one predetermined flow path, which is fluidically separated from the component, for draining off the condensate from the housing.

As a result, in the event of condensation, the condensate no longer forms on the component itself, but rather in a targeted manner on the condensation surface provided for this purpose, from which it is drained off in a targeted manner by means of the condensation drain(s). Accordingly, the condensate no longer causes corrosion, short circuits or other faults on the component.

A fundamental idea of the disclosure is to allow condensation in a defined region, the condensation surface, and at the same time to minimize the condensation or dewing region by heat exchange with the environment and to encapsulate it from the component, for example electronics. In order to protect the region in which condensation is allowed, the component is sealed off therefrom by means of a potting compound and protected from damage/short circuits.

Due to the condensation region defined by means of the condensation surface and a plurality of condensate drains, it is also possible, according to a further refinement explained in more detail below, to install the electronics to be protected or the component in different installation positions. In these installation positions, the condensate is always led away from the electronics or the component.

According to a variant, it can be provided that the housing has a lower part and/or an upper part, which are designed to enclose the component from two opposite sides, in particular in the region of the surface.

The component, for example, can be formed from a printed circuit board and a power module which is provided thereon and is contacted on the printed circuit board and has the cooling system on a side facing away from the printed circuit board. Due to excessive cooling or cooling of the power module when the power module is deactivated, condensation can occur on a side of the printed circuit board facing away from the power module, so that the surface of the component on which condensation can occur is equal to the surface of the printed circuit board facing away from the power module in the region of the power module.

The two-part housing of the condensate draining device can accordingly provide that the lower part of the housing adjoins the cooling system and encloses the power module on a side of the printed circuit board facing the cooling system, wherein the upper part of the housing is provided on the side of the printed circuit board facing away from the cooling system and thus encloses the surface on which the condensation can occur.

It is further preferably provided that the condensation surface in the condensation chamber is exposed, thus is in particular free of the housing or a material of the housing, and forms part of a surface delimiting the condensation chamber. Accordingly, the condensation chamber is delimited in certain sections by the housing and in certain sections by the condensation surface.

For draining the condensate, it is preferably provided that the at least one condensate drain or each of the condensate drains is designed to drain a condensate forming on the condensation surface and accumulating in the condensate chamber from the housing by gravity along the flow path such that its is fluidically separated from the component. For this purpose, a respective condensate drain can also have guide grooves and/or fluid channels through which the condensate can be drained off from the housing.

In principle, a component from which the condensate draining device according to the disclosure is to drain off the condensate can be arranged in different installation positions or orientations in space. Also, in particular in the case of transient systems, a change of orientation in space can occur during operation. As an example, the component can be arranged in a first spatial orientation or in a second spatial orientation that is different from the first one, or it can change its spatial orientation from the first to the second orientation. In order to ensure draining of the condensate in the first and the second orientation and preferably in all possible orientations, an advantageous refinement provides that the housing has a first condensate draining device which determines at least a first predetermined flow path fluidically separated from the component for draining off the condensate from the housing, and a second condensate draining device which determines at least a second predetermined flow path fluidically separated from the component for draining off the condensate from the housing. The condensate draining device can be fixed to the component and preferably does not change the relative position with respect to the component, so that it can be arranged with the component in the first spatial orientation or in the second spatial orientation differing therefrom, or that it changes the spatial orientation with the component. For draining the condensate, it is provided that in the first spatial orientation, the condensate can be guided out of the housing via the first condensate drain and/or via the second condensate drain and in the second spatial orientation via the second condensate drain and/or via the first condensate drain.

In this case, it can be provided that the condensate can flow off exclusively via the first condensate drain in the first orientation and exclusively via the second condensate drain in the second orientation. For example, this can be the case if the component is rotated from a first orientation by 90° or 180° about a spatial axis orthogonal to a vertical axis of the space to a second orientation.

Preferably, for a multiplicity of orientations and further preferably for each possible spatial orientation of the component, at least one associated condensate drain is provided through which the condensate can be guided out of the housing, in particular by gravity.

The housing and its condensate chamber can in particular also be funnel-shaped and open on a side opposite the condensation surface. As a result, the outer wall of the housing forming the funnel forms a multiplicity of condensate drains.

Preferably, due to the funnel shape, the condensate chamber widens with increasing distance from the condensation surface.

To prevent condensate from accumulating at the bottom of the condensation chamber or at the condensation surface, one or more condensate drains can also be provided adjacent to the condensation surface. Preferably, the condensate chamber has a rectangular basic shape, wherein in at least one of the corners and preferably each of the corners in each case one condensate drain can be provided. Starting from the condensation surface, in each case one guide groove can be provided, which leads in each case to one condensate drain, so that the condensate can flow from the condensation surface through the guide groove into a respective condensate drain. Such guide grooves can be formed, for example, by one or more inclined planes.

In this case, the component or, for example, a printed circuit board as part of the component can have an opening through which the at least one condensate drain or one of the condensate drains can extend.

Preferably, the heat conducting element is formed from a potting compound or a lacquer or a flowable and curable protective compound which, accordingly, is still flowable or liquid during processing and can then cure to form the heat conducting element.

The housing can have a mold chamber for receiving the heat conducting element, wherein the mold chamber is completely filled by the heat conducting element. In this case, a wall of the mold chamber can be formed in certain sections by the housing and in certain sections by the component and/or the cooling device. Further, the mold chamber is designed to enclose the component at least in certain sections and to completely enclose the surface of the component. The mold chamber forms a mold for the potting compound. Accordingly, the mold chamber is preferably open exclusively towards the condensate chamber so that the potting compound can be introduced into the mold chamber through the condensate chamber and the potting compound cured to form the heat conducting element closes the opening of the mold chamber to the condensation chamber and forms the condensation surface.

In order to be able to form, together with the component, a fluid-tight mold chamber as a mold for the casting compound, it can be provided according to a further embodiment variant that the housing has at least one sealing section, which is formed in particular as a sealing lip, for example for resting against the component. The sealing section is designed to seal off the mold chamber formed as a mold, from an environment, in particular by cooperating with the component, and preferably in a fluid-tight manner. If the housing has a lower part and an upper part or if the housing is formed in multiple parts, a sealing section formed in particular as a sealing lip can also be provided on each part or at least on a plurality of parts of the housing.

Another aspect relates to an electronics assembly comprising a cooling device, at least one electrical component and a condensate draining device according to the disclosure. In this case, the electronic assembly can also be referred to as the electronic unit. The cooling device for cooling the at least one component is arranged on the component or components, and the at least one component has a surface on which, at least without condensate draining device, condensation can occur as a result of the cooling by means of the cooling device, which is accordingly prevented by the condensate draining device according to the disclosure.

Preferably, the electronic assembly is provided with an assembly housing which, in particular, surrounds the at least one component with the condensate draining device. In this case, the housing of the condensate draining device is arranged in particular completely within the assembly housing. The at least one condensate drain is designed in each case to discharge the condensate from the assembly housing. Accordingly, the condensate chamber can be fluidically connected or flow-connected to an environment surrounding the assembly housing via each of the condensate drains, so that the condensate can preferably be guided into the environment by gravity.

In addition, an important aspect of the disclosure relates to a method of producing an electronic assembly according to the disclosure. In this case, the housing is arranged resting against the at least one component to form the mold chamber and is preferably sealed with respect to the at least one component and is further preferably sealed in a liquid-tight manner so that the mold chamber is open exclusively towards the condensate chamber and liquid (condensate) can only flow off or be discharged via the condensate chamber. Sealing, for example in a gas-tight manner, is not necessary. Subsequently, a potting compound is filled through an opening to the condensate chamber into the mold chamber and distributed in the mold chamber by gravity and completely fills the mold chamber which forms the heat conducting element after the potting compound has cured.

The features disclosed above can be combined in any desired manner, provided this is technically possible and they do not contradict one another.

BRIEF DESCRIPTION OF THE DRAWINGS

Other advantageous further embodiments of the disclosure are indicated in the subclaims or are illustrated in more detail below together with the description of the preferred embodiment of the disclosure with reference to the figures. In the figures:

DETAILED DESCRIPTION

FIGS. 1 to 4 are exemplary schematic illustrations and show a condensate draining device 1 or an electronic assembly with a cooling device 4, a component 2 cooled by the cooling device 4, and with a condensate draining device 1. Identical reference signs in the figures indicate identical functional and/or structural features. Although not every reference sign is used in every figure, corresponding features are present. Accordingly, the following description applies to all figures.

Figure 3:
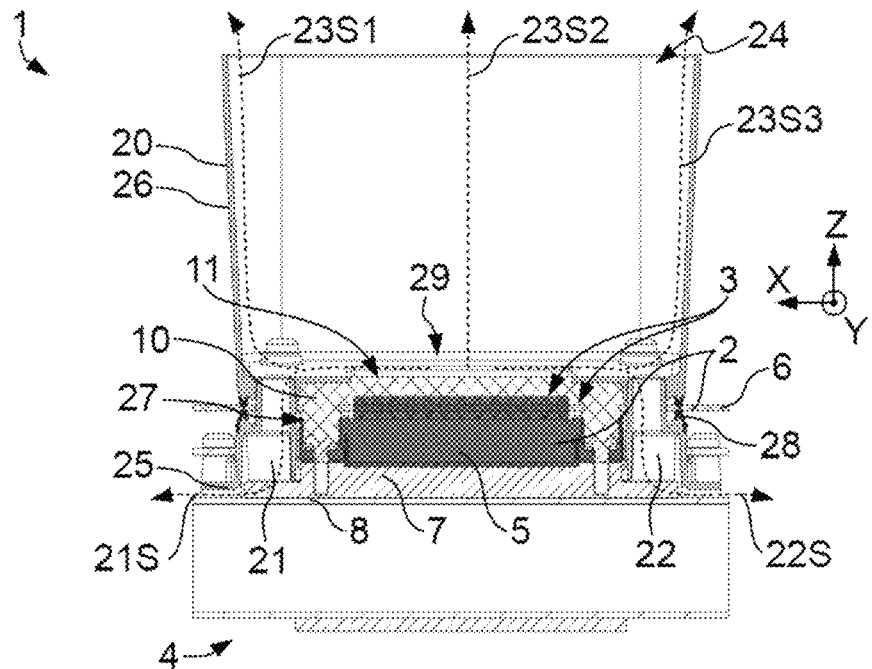
FIG. 3 shows a first section through the condensate draining device.
Figure 4:
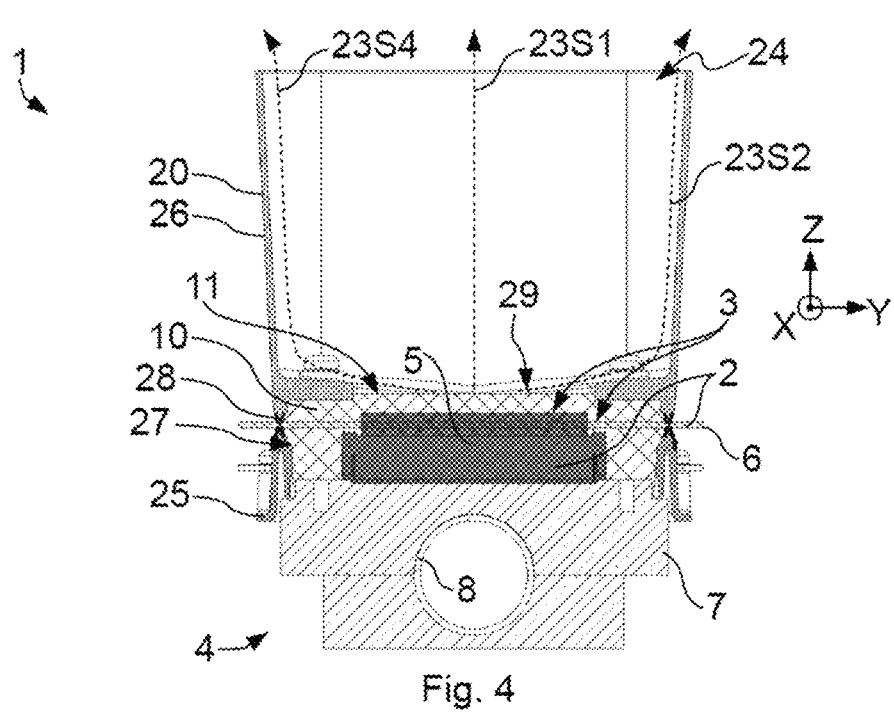
FIG. 4 shows a second section through the condensate draining device.

As can be seen in particular in FIGS. 3 and 4, the component 2 has an exemplary power electronics 5 which is electrically contacted on a printed circuit board 6.

During operation, the power electronics 5 can get quite warm, so that it has be cooled by the cooling device 4. For this purpose, the cooling device 4 has a heat sink 7 which dissipates the heat from the power electronics 5 and transfers it to a cooling tube 8 or to a cooling liquid flowing through the cooling tube 8.

In most cases, a multiplicity of components are cooled by the cooling liquid, so that the cooling liquid also flows past the heat sink 7 or the component 2 in a cooling manner when the power electronics 5 is deactivated, i.e. switched off, and accordingly does not emit any heat.

This results in low temperatures at the component 2, which can lead to condensation on the component 2 and in particular to condensation on a surface 3 of the component 2.

The condensate draining device 1 is provided for the targeted discharge of condensate that otherwise forms on the component 2.

The condensate draining device has a housing 20, which consists of an upper part 26 and a lower part 25.

The lower part 25 is provided on a first side or a lower side of the printed circuit board 6, on which the power electronics 5 and the cooling device 4 are also arranged. In this case, the lower part 25 extends around the power electronics in a circumferential direction about a vertical axis Z lying in the image plane and seals tightly against the heat sink 7 and, by means of a sealing lip 28, tightly against the printed circuit board 6.

The upper part 26 is arranged on the opposite side of the printed circuit board 6 with respect to the lower part 25 and seals with the printed circuit board 6 by means of a further sealing lip 28.

As a result, the upper part 26 and the lower part 25 of the housing 20 together define a fluid-tight mold chamber 27 around the power electronics 5, on which the surface 3 of the component is located where condensation can occur. Here, the mold chamber 27 is opened exclusively through an opening 29 to a condensate chamber 24 formed by the housing 20. As a result, the mold chamber 27 forms a mold in which the power electronics 5 and sections of the printed circuit board 6 or, more generally, a part of the component 2 and the entire surface 3 at which condensation can occur are arranged or accommodated.

During the production process, a potting compound, which is still flowable or liquid, is then filled into the mold chamber 27 forming a mold, which potting compound is distributed in the mold chamber 27 and completely fills it. As the potting compound hardens, it forms a heat conducting element 10 which completely covers the surface 3 on which condensation can occur and thus prevents condensation thereon.

Since the housing 20, with the exception of the region of the opening 29, rests directly against the heat conducting element 10 and preferably has significantly poorer thermal conductivity than the heat conducting element 10, condensation can only occur in the region of the opening 29 or the condensation surface 11 formed in the region of the opening 29. Consequently, condensation on the component 2 is prevented and is caused on the condensation surface 11 in a targeted manner.

The condensation surface 11 is located in the condensate chamber 24 or forms part of the surface delimiting the condensate chamber 24. Accordingly, a condensate formed on the condensation surface 11 is collected in the condensate chamber 24. To prevent a defect and damage to surrounding areas, it must be ensured that the condensate can be discharged from the condensate chamber 24 in a targeted and safe manner.

Figure 1:
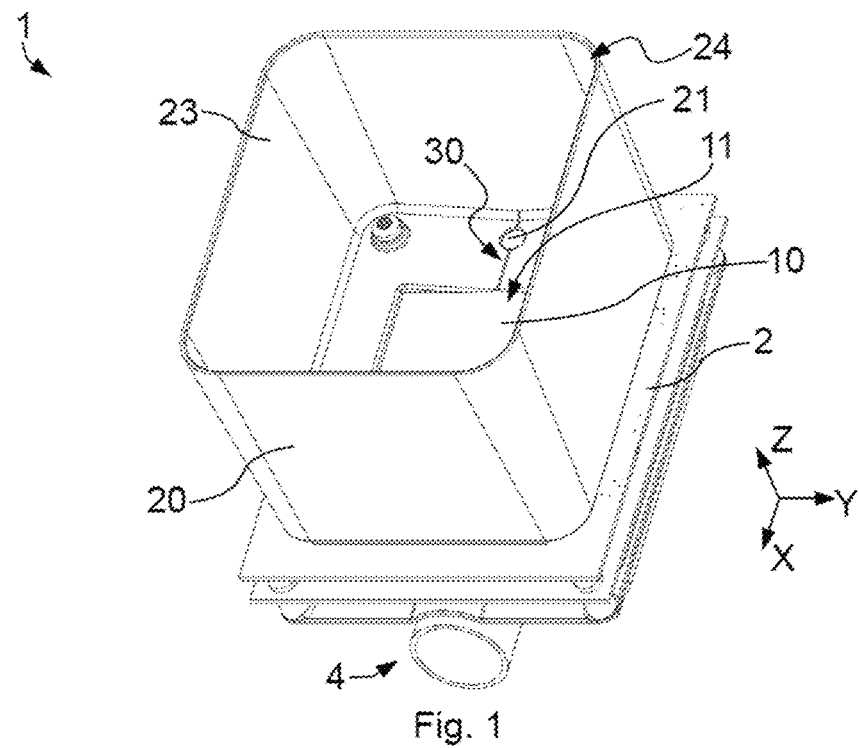
FIG. 1 shows a perspective view of a condensate draining device mounted on a component.
Figure 2:
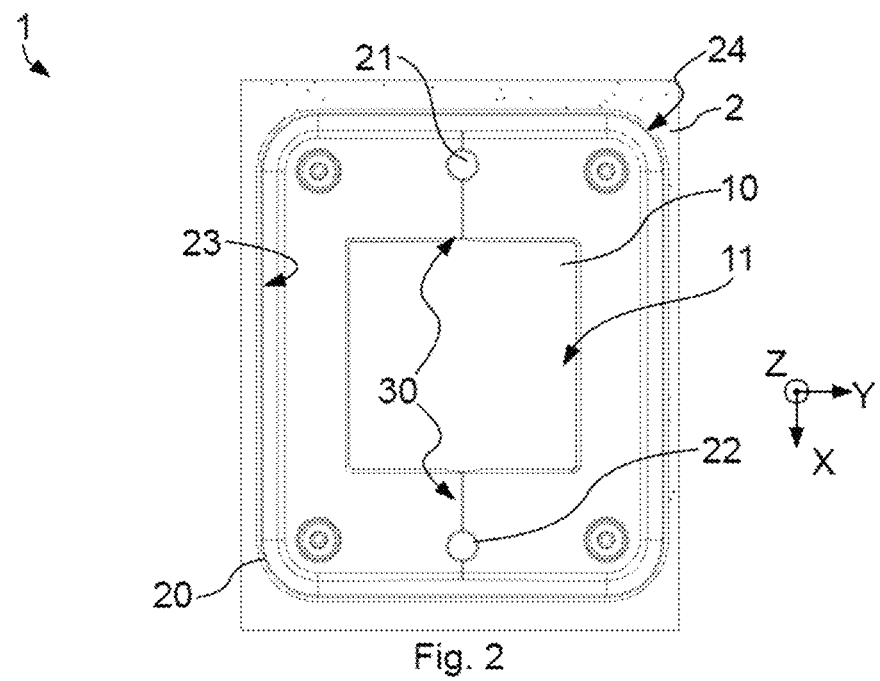
FIG. 2 shows a top view of the condensate draining device.

In the installation position shown, for example, in FIGS. 3 and 4, in which the force of gravity acts parallel to the vertical axis Z and downwards in the plane of illustration, the condensate can be discharged from the condensation surface 11 via guide grooves 30 formed for this purpose to a first and second condensate drain 21, 22, which can be seen in particular in FIGS. 1 and 2.

In this case, the guide grooves 30 and the condensate drains 21, 22 are formed by the housing 20. Through the first and second condensate drains 21, 22, the condensate can be discharged from the component 2 in a fluidically separated manner, wherein recesses are provided for this purpose in the component 2 or in the printed circuit board 6 of the component, through which the first and second condensate drains 21, 22 pass.

An important aspect of a particularly advantageous refinement of the disclosure is to be able to discharge the condensate from the condensate chamber 24 not only in a single predetermined position, but to be able to discharge the condensate from the condensate chamber 24 in a multiplicity of positions, so that the condensate draining device 1 can be used on differently positioned components 2 or can change the spatial orientation or the position in space together with the component 2 while reliable condensate draining is still to be ensured.

For this purpose, the condensate chamber 24 is designed as an open funnel, which is open on a side facing away from the component 2 along the vertical axis Z.

Starting from an initial position as shown in FIGS. 3 and 4, the condensate can first flow off by gravity through the first and second condensate drains 21, 22 and along the flow paths 21S, 22S defined by them. If the component 2 with the condensate draining device 1 is rotated about the spatial axis Y or arranged rotated with it, the condensate can flow off through the first condensate drain 21 or the second condensate drain 22 up to a limiting angle. If the rotation exceeds the limiting angle, the condensate can no longer enter the first or second condensate drain 21, 22, but flows off via a condensate drain 23 formed by the funnel shape of the condensate chamber 24, with the condensate chamber 24 forming a multiplicity of possible condensate drains 23 due to its upwardly open shape. Four possible flow paths 23S1 to 23S4 are shown by way of example. If the rotation around the spatial axis Y exceeds the limiting angle, the condensate can flow out of the condensate chamber 24 along the flow path 23S1 or along the flow path 23S3, depending on the direction of rotation around the spatial axis Y.

In the present example, the limiting angle is assumed to be approximately 90°.

Accordingly, the condensate draining device 1 can be rotated or arranged rotated about the spatial axis Y as desired, in each case ensuring that the condensate is discharged safely and fluidically separated from the component.

Two further flow paths 23S2 and 23S4 are also shown by way of example, which, when the condensate draining device 1 is rotated about the spatial axis X, enable condensate to be drained off from the condensate chamber 24.

Not shown in the present case is that in addition to the first and second condensate drains 21, 22, further condensate drains can be provided which pass through the printed circuit board 6.

Not shown in the figures is that the entire electronic assembly can comprise a housing enclosing the component 2 and the condensate draining device 1. Preferably, the condensate drains 21, 22, 23 are arranged to extend out of the housing so that the condensate can be fed out of the housing along the flow paths 21S, 22S, 23S1, 23S2, 23S3, 23S4 and, for example, by means of hoses, without being able to come into fluidic contact with the component.

The disclosure is not limited in its embodiment to the preferred exemplary embodiments indicated above. Rather, a number of variants is conceivable which make use of the solution presented even in fundamentally different embodiments.

The invention claimed is:

1. A condensate draining device for discharging condensate from at least one cooled component having a cooled electronic system and a surface on which condensate formation can occur, the condensate draining device comprising:
    a heat conducting element which has a condensation surface and which is configured to at least partially cover the surface of the at least one component and to transfer a cold causing condensation on the surface of the at least one component to the condensation surface; and
    a housing with at least one condensate drain and/or a condensate chamber for collecting a condensate forming on the condensation surface, wherein the housing has a lower part and/or an upper part, which are designed to enclose the at least one component from two opposite sides in the region of the surface,
    wherein the at least one condensate drain determines in each case at least one predetermined flow path which is fluidically separated from the at least one component for draining off the condensate from the housing.

2. The condensate draining device according to claim 1, wherein the condensation surface in the condensate chamber is exposed and forms part of a surface delimiting the condensate chamber.

3. The condensate draining device according to claim 1, wherein the at least one condensate drain is designed to drain off a condensate forming on the condensation surface and accumulating in the condensate chamber from the housing along the flow path such that it is fluidically separated from the at least one component.

4. The condensate draining device according to claim 1, wherein the at least one component can be arranged in a first spatial orientation or in a second spatial orientation differing therefrom,
    wherein the housing has a first condensate drain which determines at least one first predetermined flow path fluidically separated from the at least one component for draining off the condensate from the housing,
    and has a second condensate drain which determines at least one second predetermined flow path fluidically separated from the at least one component for draining off the condensate from the housing, and
    wherein the condensate draining device can be arranged with the at least one component in the first spatial orientation or in the second spatial orientation differing therefrom, and
    wherein in the first spatial orientation, the condensate can be guided out of the housing via the first condensate drain and/or via the second condensate drain and in the second spatial orientation via the second condensate drain and/or via the first condensate drain.

5. The condensate draining device according to claim 1, wherein the heat conducting element is formed from a flowable and curable protective mass.

6. The condensate draining device according to claim 5, wherein the housing has a mold chamber for accommodating the heat conducting element, wherein the mold chamber is completely filled by the heat conducting element and is designed to enclose the at least one component at least in certain sections and the surface of the at least one component completely, and forms a mold for the potting compound.

7. The condensate draining device according to claim 6, wherein the housing has at least one sealing section which is formed in particular by a sealing lip and which is designed to seal off the mold chamber formed as a mold from an environment, in particular by cooperating with the at least one component.

8. An electronic assembly with a cooling device, at least one electrical component and a condensate draining device according to claim 1,
wherein the cooling device for cooling the at least one component is arranged on the latter and the at least one component has a surface on which condensate formation can occur as a result of the cooling by means of the cooling device.

9. The electronic assembly according to claim 8, further having an assembly housing,
wherein the housing of the condensate draining device is arranged in particular completely within the assembly housing and the at least one condensate drain is designed in each case to discharge the condensate from the assembly housing.

10. A method for producing an electronic assembly according to claim 9, wherein the housing has a mold chamber for accommodating the heat conducting element, the method comprising:
arranging the housing forming the mold chamber to rest against the at least one component and to seal to the at least one component so that the mold chamber is open exclusively towards the condensate chamber,
filling the mold chamber with a potting compound through an opening to the condensate chamber, which potting compound is distributed in the mold chamber by gravity and completely fills the mold chamber, and
curing the potting compound such that the potting compound forms the heat conducting element.

\* \* \* \* \*